US010913879B2

(12) United States Patent
Bai et al.

(10) Patent No.: US 10,913,879 B2
(45) Date of Patent: Feb. 9, 2021

(54) THERMALLY CONDUCTIVE PRE-APPLIED UNDERFILL FORMULATIONS AND USES THEREOF

(71) Applicant: Henkel IP & Holding GmbH, Duesseldorf (DE)

(72) Inventors: Jie Bai, Aliso Viejo, CA (US); Ly Do, Cypress, CA (US); Hung Chau, Fountain Valley, CA (US); Younsang Kim, Foothill Ranch, CA (US); Julissa Eckenrode, Tustin, CA (US)

(73) Assignee: Henkel IP & Holding GmbH, Duesseldorf (DE)

( * ) Notice: Subject to any disclaimer, the term of this patent is extended or adjusted under 35 U.S.C. 154(b) by 145 days.

(21) Appl. No.: 15/229,596

(22) Filed: Aug. 5, 2016

(65) Prior Publication Data
US 2016/0340557 A1  Nov. 24, 2016

Related U.S. Application Data

(63) Continuation of application No. PCT/US2015/016779, filed on Feb. 20, 2015.

(60) Provisional application No. 61/943,635, filed on Feb. 24, 2014.

(51) Int. Cl.
| | |
|---|---|
| C09K 5/14 | (2006.01) |
| C09J 9/00 | (2006.01) |
| C09J 11/04 | (2006.01) |
| H01L 23/373 | (2006.01) |
| H01L 23/29 | (2006.01) |
| C09J 179/08 | (2006.01) |
| C09J 183/04 | (2006.01) |
| C08G 59/50 | (2006.01) |
| C08L 63/00 | (2006.01) |
| C08K 3/38 | (2006.01) |
| C08K 3/22 | (2006.01) |
| C08K 3/36 | (2006.01) |
| C08L 79/08 | (2006.01) |
| C08K 5/14 | (2006.01) |
| C08L 33/00 | (2006.01) |
| C09J 5/00 | (2006.01) |
| C08L 75/04 | (2006.01) |

(52) U.S. Cl.
CPC ............ *C09J 9/00* (2013.01); *C08G 59/5073* (2013.01); *C08K 3/22* (2013.01); *C08K 3/36* (2013.01); *C08K 3/38* (2013.01); *C08K 5/14* (2013.01); *C08L 33/00* (2013.01); *C08L 63/00* (2013.01); *C08L 79/08* (2013.01); *C09J 5/00* (2013.01); *C09J 11/04* (2013.01); *C09J 179/085* (2013.01); *C09J 183/04* (2013.01); *C09K 5/14* (2013.01); *H01L 23/293* (2013.01); *H01L 23/3737* (2013.01); *C08K 2003/2227* (2013.01); *C08K 2003/385* (2013.01); *C08L 75/04* (2013.01); *C09J 2433/00* (2013.01); *C09J 2463/00* (2013.01); *C09J 2479/00* (2013.01); *H01L 2924/0002* (2013.01)

(58) Field of Classification Search
CPC combination set(s) only.
See application file for complete search history.

(56) References Cited

U.S. PATENT DOCUMENTS

| | | | |
|---|---|---|---|
| 5,717,034 A | 2/1998 | Dershem et al. | |
| 2002/0162685 A1* | 11/2002 | Gotro | H05K 3/4626 174/258 |
| 2009/0062449 A1 | 3/2009 | Wang | |
| 2009/0194859 A1 | 8/2009 | Kang et al. | |
| 2010/0213403 A1 | 8/2010 | Hasegawa et al. | |
| 2011/0084408 A1 | 4/2011 | Shishido et al. | |
| 2011/0084413 A1 | 4/2011 | Shishido et al. | |
| 2017/0335160 A1* | 11/2017 | Yamazaki | C01B 35/146 |

FOREIGN PATENT DOCUMENTS

| | | | |
|---|---|---|---|
| CN | 101565587 | * | 10/2009 |
| CN | 102786726 A | | 11/2012 |
| CN | 102786815 A | | 11/2012 |
| CN | 103059787 A | | 4/2013 |
| EP | 1265281 | * | 12/2002 |
| EP | 1265281 A2 | | 12/2002 |
| JP | H09324127 A | | 12/1997 |
| JP | 2000273426 A | | 10/2000 |
| JP | 2000281995 A | | 10/2000 |
| JP | 2002363421 A | | 12/2002 |
| JP | 2010065064 A | | 3/2010 |
| JP | 2010229295 A | | 10/2010 |

(Continued)

OTHER PUBLICATIONS

US 9,783,722 B2, 10/2017, Yamazaki et al. (withdrawn)

*Primary Examiner* — Monique R Peets
(74) *Attorney, Agent, or Firm* — Steven C. Bauman

(57) ABSTRACT

Provided herein are thermally conductive underfill compositions which have a combination of melt viscosity, glass transition temperature (Tg), coefficient of thermal expansion, and/or transparency that renders such materials useful for the preparation of a variety of electronic devices, such as flip chip packages, stacked dies, hybrid memory cubes, through-silica via (TSV) devices, and the like. In certain embodiments of the invention, there are provided assemblies comprising a first article permanently adhered to a second article by a cured aliquot of a formulation as described herein. In certain embodiments of the invention, there are provided methods for adhesively attaching a first article to a second article. In certain embodiments of the present invention, there are provided methods for improving heat dissipation by electronic devices assembled employing thermally conductive, but electrically non-conductive adhesive.

20 Claims, No Drawings

(56) References Cited

FOREIGN PATENT DOCUMENTS

| | | | |
|---|---|---|---|
| JP | 2011102383 | | 5/2011 |
| JP | 2011107553 | A | 6/2011 |
| JP | 2011162642 | A | 8/2011 |
| JP | 2011208024 | * | 10/2011 |
| JP | 2011208024 | A | 10/2011 |
| JP | 2012000960 | A | 1/2012 |
| JP | 2012255086 | A | 12/2012 |
| JP | 2013006893 | | 1/2013 |
| JP | 2013241321 | | 12/2013 |
| WO | 2004011540 | A2 | 2/2004 |
| WO | 2005024939 | A1 | 3/2005 |
| WO | 2010047278 | A1 | 4/2010 |
| WO | 2011040184 | A1 | 4/2011 |
| WO | 2011112016 | A2 | 9/2011 |
| WO | 2012102212 | | 8/2012 |
| WO | 2015056523 | | 4/2015 |

\* cited by examiner

THERMALLY CONDUCTIVE PRE-APPLIED UNDERFILL FORMULATIONS AND USES THEREOF

BACKGROUND

Field

The present invention relates to thermally conductive underfill compositions. In one aspect, the invention relates to thermally conductive underfill films, especially pre-applied thermally conductive underfill films. In another aspect, the invention relates to compositions containing particulate filler having good thermal conductivity properties, and the use thereof in the preparation of various electronic devices. In yet another aspect, the invention relates to compositions having good performance properties, e.g., melt viscosity, glass transition temperature (Tg), coefficient of thermal expansion, and/or transparency which render such materials useful in a variety of applications.

SUMMARY

In accordance with the present invention, there are provided thermally conductive underfill compositions which have a combination of melt viscosity, glass transition temperature (Tg), coefficient of thermal expansion, and/or transparency that renders such materials useful for the preparation of a variety of electronic devices, such as flip chip packages, stacked dies, hybrid memory cubes, through-silica via (TSV) devices, and the like.

In certain embodiments of the invention, there are provided assemblies comprising a first article permanently adhered to a second article by a cured aliquot of a formulation as described herein.

In certain embodiments of the invention, there are provided methods for adhesively attaching a first article to a second article, said methods comprising:
 (a) applying an aliquot of a formulation according to the present invention to a first article,
 (b) bringing the first and second articles into intimate contact to form an assembly wherein the space between said first article and said second article is substantially completely filled by the formulation applied in step (a), and thereafter
 (c) optionally subjecting said assembly to conditions suitable to cure said formulation.

In certain embodiments of the present invention, there are provided methods for improving heat dissipation by electronic devices assembled employing thermally conductive, but electrically non-conductive adhesive. Invention methods comprise employing as the filler for said thermally conductive, but electrically non-conductive adhesive a filler which imparts sufficient thermal conductivity to said formulation such that the formulation, upon cure, has a thermal conductivity of at least 0.5 W/mK.

DETAILED DESCRIPTION OF THE INVENTION

In accordance with the present invention, there are provided formulations comprising:
 a thermosetting resin composition,
 a curing agent, and
 a filler which imparts sufficient thermal conductivity to said formulation such that the formulation, upon cure, has a bulk thermal conductivity of greater than 0.5 W/mK, as measured by the laser flash method,
wherein:
 the formulation, as a B-staged film, has a minimum melt viscosity of <40,000 P, as measured by Ares Rheometer at 10 Rad frequency with a 10° C./min ramp rate using a sample 1 inch in diameter and 1 mm thick.

In certain embodiments, the melt viscosity of invention compositions, and particle size of the particulate filler employed therein, is suitable to allow use thereof as underfill material, wherein said compositions are capable of flowing into small gaps (e.g., gaps as small as 10-20 microns).

In certain embodiments, invention formulations, as a B-staged film, after cure, have a Tg greater than 80° C.

In certain embodiments, invention formulations, as a B-staged film, after cure, have a coefficient of thermal expansion below Tg (CTE1) of less than 60 ppm/° C. and a coefficient of thermal expansion above Tg (CTE2) of less than 160 ppm/° C.

In certain embodiments, invention formulations, as a B-staged film, have a transmittance of at least 10% at a wavelength of 555 nm.

In certain embodiments, underfill films prepared from invention compositions have at least 70% transparency to wavelengths of 555 nm or longer.

In certain embodiments, invention formulations, upon cure, have a thermal conductivity of at least about 1.0 W/mK. In certain embodiments, invention formulations, upon cure, have a thermal conductivity of at least about 1.5 W/mK.

Compositions according to the present invention may optionally further comprise one or more flow additives, adhesion promoters, conductivity additives, rheology modifiers, toughening agents, fluxing agents, and the like, as well as mixtures of any two or more thereof.

As used herein, the term "flow additives" refers to compounds which modify the viscosity of the formulation to which they are introduced. Exemplary compounds which impart such properties include silicon polymers, ethyl acrylate/2-ethylhexyl acrylate copolymers, alkylol ammonium salts of phosphoric acid esters of ketoxime, and the like, as well as combinations of any two or more thereof.

As used herein, the term "adhesion promoters" refers to compounds which enhance the adhesive properties of the formulation to which they are introduced.

As used herein, the term "conductivity additives" refers to compounds which enhance the electrically conductive properties of the formulation to which they are introduced.

As used herein, the term "rheology modifiers" refers to additives which modify one or more physical properties of the formulation to which they are introduced.

As used herein, the term "toughening agents" refers to additives which enhance the impact resistance of the formulation to which they are introduced.

As used herein, the term "fluxing agents" refers to reducing agents which prevent oxides from forming on the surface of the molten metal. Fluxing agents are employed to remove metal oxides and prevent reoxidation. While many different fluxing materials may be employed, the fluxing agent is preferably a carboxylic acid, including rosin gum, dodecanedioic acid (commercially available as Corfree M2 from Aldrich), adipic acid, sebasic acid, polysebasic polyanhydride, maleic acid, tartaric acid, citric acid, and the like. Fluxing agents may also include alcohols, hydroxyl acid and hydroxyl base. Exemplary fluxing materials include polyols (e.g., ethylene glycol, glycerol, 3-[bis(glycidyl oxy methyl)

methoxy]-1,2-propane diol, D-ribose, D-cellobiose, cellulose, 3-cyclohexene-1,1-dimethanol and the like.

The strength of an acid is an important factor because the acid should be sufficiently strong to wash oxides out of the solder and the substrate. Preferably, the $pK_a$ of the acid should be greater than 5. Stability of the acid at temperatures around 183° C. is important, and the acid should not decompose at temperatures lower than 183° C. As solder reflows at 183° C., a flux material that cannot withstand that temperature is unsuitable for proper formulation.

Latent fluxing agents can also be employed in the practice of the present invention, including any suitable material that will liberate a fluxing agent, in the form of a phenolic and/or a carboxylic acid, when heated above a predetermined temperature, such as above about 140° C. In particular, the material includes a composition which is a reaction product of a vinyl ether constituent and a phenolic or carboxylic acid constituent, with the reaction product including at least one thermally labile alpha-alkoxyalkyl ester linkage or alpha-alkoxyalkyl phenyl ether linkage.

Exemplary thermosetting resin compositions contemplated for use herein include maleimides, nadimides, itaconamides, epoxies, (meth)acrylates, cyanate esters, vinyl group-containing resins, cyclic esters (e.g., E-caprolactone), benzoxazines, oxetanes, silicone resins, polyester, polyurethane, polyimide, melamine, urea-formaldehyde, phenol-formaldehyde, and the like, as well as mixtures of any two or more thereof.

Exemplary maleimides, nadimides, or itaconimides contemplated for use herein include compounds having the structure:

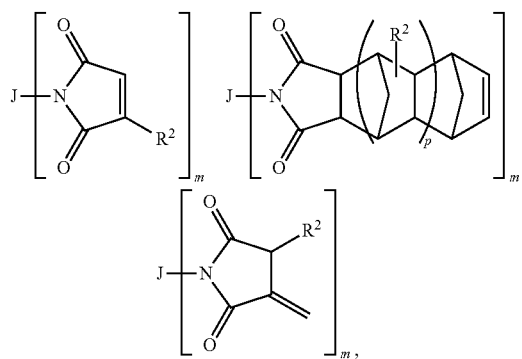

respectively, wherein:
m is 1-15,
p is 0-15,
each $R^2$ is independently selected from hydrogen or lower alkyl, and
J is a monovalent or a polyvalent radical selected from:
hydrocarbyl or substituted hydrocarbyl species typically having in the range of about 6 up to about 500 carbon atoms, where the hydrocarbyl species is selected from alkyl, alkenyl, alkynyl, cycloalkyl, cycloalkenyl, aryl, alkylaryl, arylalkyl, aralkenyl, alkenylaryl, arylalkynyl or alkynylaryl;
hydrocarbylene or substituted hydrocarbylene species typically having in the range of about 6 up to about 500 carbon atoms, where the hydrocarbylene species are selected from alkylene, alkenylene, alkynylene, cycloalkylene, cycloalkenylene, arylene, alkylarylene, arylalkylene, arylalkenylene, alkenylarylene, arylalkynylene or alkynylarylene,
aromatic hydrocarbyl or substituted aromatic hydrocarbyl species having in the range of about 6 up to about 300 carbon atoms, where the aromatic hydrocarbyl species is selected from aryl, alkylaryl, arylalkyl, aryalkenyl, alkenylaryl, arylalkynyl or alkynylaryl;
aromatic hydrocarbylene or substituted aromatic hydrocarbylene species having in the range of about 6 up to about 300 carbon atoms, where the aromatic hydrocarbylene species are selected from arylene, alkylarylene, arylalkylene, arylalkenylene, alkenylarylene, arylalkynylene or alkynylarylene,
heterocyclic or substituted heterocyclic species having in the range of about 6 up to about 300 carbon atoms,
polysiloxane, or
polysiloxane-polyurethane block copolymers, as well as combinations of one or more of the above with a linker selected from a covalent bond, —O—, —S—, —NR—, —NR—C(O)—, —NR—C(O)—O—, —NR—C(O)—NR—, —S—C(O)—, —S—C(O)—O—, —S—C(O)—NR—, —O—S(O)$_2$—, —O—S(O)$_2$—O—, —O—S(O)$_2$—NR—, —O—S(O)—, —O—S(O)—O—, —O—S(O)—NR—, —O—NR—C(O)—, —O—NR—C(O)—O—, —O—NR—C(O)—NR—, —NR—O—C(O)—, —NR—O—C(O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—O—, —O—NR—S(O)$_2$—NR—, —O—NR—S(O)$_2$—, —O—P(O)R$_2$—, —S—P(O)R$_2$—, or —NR—P(O)R$_2$—; where each R is independently hydrogen, alkyl or substituted alkyl.

Compositions according to the present invention include compounds wherein J is oxyalkyl, thioalkyl, aminoalkyl, carboxyalkyl, oxyalkenyl, thioalkenyl, aminoalkenyl, carboxyalkenyl, oxyalkynyl, thioalkynyl, aminoalkynyl, carboxyalkynyl, oxycycloalkyl, thiocycloalkyl, aminocycloalkyl, carboxycycloalkyl, oxycloalkenyl, thiocycloalkenyl, aminocycloalkenyl, carboxycycloalkenyl, heterocyclic, oxyheterocyclic, thioheterocyclic, aminoheterocyclic, carboxyheterocyclic, oxyaryl, thioaryl, aminoaryl, carboxyaryl, heteroaryl, oxyheteroaryl, thioheteroaryl, aminoheteroaryl, carboxyheteroaryl, oxyalkylaryl, thioalkylaryl, aminoalkylaryl, carboxyalkylaryl, oxyarylalkyl, thioarylalkyl, aminoarylalkyl, carboxyarylalkyl, oxyarylalkenyl, thioarylalkenyl, aminoarylalkenyl, carboxyarylalkenyl, oxyalkenylaryl, thioalkenylaryl, aminoalkenylaryl, carboxyalkenylaryl, oxyarylalkynyl, thioarylalkynyl, aminoarylalkynyl, carboxyarylalkynyl, oxyalkynylaryl, thioalkynylaryl, aminoalkynylaryl or carboxyalkynylaryl, oxyarylene, thioarylene, aminoarylene, carboxyarylene, oxyalkylarylene, thioalkylarylene, aminoalkylarylene, carboxyalkylarylene, oxyarylalkylene, thioarylalkylene, aminoarylalkylene, carboxyarylalkylene, oxyarylalkenylene, thioarylalkenylene, aminoarylalkenylene, carboxyarylalkenylene, oxyalkenylarylene, thioalkenylarylene, aminoalkenylarylene, carboxyalkenylarylene, oxyarylalkynylene, thioarylalkynylene, aminoarylalkynylene, carboxy arylalkynylene, oxyalkynylarylene, thioalkynylarylene, aminoalkynylarylene, carboxyalkynylarylene, heteroarylene, oxyheteroarylene, thioheteroarylene, aminoheteroarylene, carboxyheteroarylene, heteroatom-containing di- or polyvalent cyclic moiety, oxyheteroatom-containing di- or polyvalent cyclic moiety, thioheteroatom-containing di- or polyvalent cyclic moiety, aminoheteroatom-containing di- or polyvalent cyclic moiety, or a carboxyheteroatom-containing di- or polyvalent cyclic moiety.

Exemplary epoxy monomers contemplated for use in the practice of the present invention include liquid-type epoxies based on bisphenol A, solid-type epoxies based on bisphenol A, liquid-type epoxies based on bisphenol F (e.g., Epiclon EXA-835LV), multifunctional epoxies based on phenol-novolac resin, dicyclopentadiene-type epoxies (e.g., Epiclon HP-7200L), naphthalene-type epoxies, and the like, as well as mixtures of any two or more thereof.

Additional exemplary epoxy monomers contemplated for use herein include diepoxides of the cycloaliphatic alcohol, hydrogenated bisphenol A (commercially available as Epalloy 5000), difunctional cycloaliphatic glycidyl esters of hexahydrophthallic anhydride (commercially available as Epalloy 5200), Epiclon EXA-835LV, Epiclon HP-7200L, and the like, as well as mixtures of any two or more thereof.

When epoxy monomer(s) are present in invention compositions, the resulting formulation comprises in the range of about 0.5-20 wt % of said epoxy. In certain embodiments, the resulting formulation comprises in the range of about 2-10 wt % of said epoxy.

When epoxy monomer(s) are present in invention formulations, an epoxy cure agent is also present. Exemplary epoxy cure agents include ureas, aliphatic and aromatic amines, amine hardeners, polyamides, irnidazoles, dicyandiamides, hydrazides, urea-amine hybrid curing systems, free radical initiators (e.g., peroxy esters, peroxy carbonates, hydroperoxides, alkylperoxides, arylperoxides, azo compounds, and the like), organic bases, transition metal catalysts, phenols, acid anhydrides, Lewis acids, and Lewis bases.

When present, invention compositions comprise in the range of about 0.1-20 wt % of said epoxy cure agent. In certain embodiments, invention compositions comprise in the range of about 0.5-10 wt % of epoxy cure agent.

Oxetanes (obtained from 1,3-propylene oxide), are heterocyclic organic compounds containing an oxetane ring, i.e., a ring having the molecular formula $C_3H_6O$ (i.e., a four-membered ring with three carbon atoms and one oxygen atom.

Exemplary acrylates contemplated for use herein include monofunctional (meth)acrylates, difunctional (meth)acrylates, trifunctional (meth)acrylates, polyfunctional (meth)acrylates, and the like.

Exemplary monofunctional (meth)acrylates include phenylphenol acrylate, methoxypolyethylene acrylate, acryloyloxyethyl succinate, fatty acid acrylate, methacryloyloxyethylphthalic acid, phenoxyethylene glycol methacrylate, fatty acid methacrylate, β-carboxyethyl acrylate, isobornyl acrylate, isobutyl acrylate, t-butyl acrylate, hydroxyethyl acrylate, hydroxypropyl acrylate, dihydrocyclopentadiethyl acrylate, cyclohexyl methacrylate, t-butyl methacrylate, dimethylaminoethyl methacrylate, diethylaminoethyl methacrylate, t-butylaminoethyl methacrylate, 4-hydroxybutyl acrylate, tetrahydrofurfuryl acrylate, benzyl acrylate, ethylcarbitol acrylate, phenoxyethyl acrylate, methoxytriethylene glycol acrylate, monopentaerythritol acrylate, dipentaerythritol acrylate, tripentaerythritol acrylate, polypentaerythritol acrylate and the like.

Exemplary difunctional (meth)acrylates include hexanediol dimethacrylate, hydroxyacryloyloxypropyl methacrylate, hexanediol diacrylate, urethane acrylate, epoxyacrylate, bisphenol A-type epoxyacrylate, modified epoxyacrylate, fatty acid-modified epoxyacrylate, amine-modified bisphenol A-type epoxyacrylate, allyl methacrylate, ethylene glycol dimethacrylate, diethylene glycol dimethacrylate, ethoxylated bisphenol A dimethacrylate, tricyclodecanedimethanol dimethacrylate, glycerin dimethacrylate, polypropylene glycol diacrylate, propoxylated ethoxylated bisphenol A diacrylate, 9,9-bis(4-(2-acryloyloxyethoxy)phenyl) fluorene, tricyclodecane diacrylate, dipropylene glycol diacrylate, polypropylene glycol diacrylate, PO-modified neopentyl glycol diacrylate, tricyclodecanedimethanol diacrylate, 1,12-dodecanediol dimethacrylate, and the like.

Exemplary trifunctional (meth)acrylates include trimethylolpropane trimethacrylate, trimethylolpropane triacrylate, trimethylolpropane ethoxy triacrylate, polyether triacrylate, glycerin propoxy triacrylate, and the like.

Exemplary polyfunctional (meth)acrylates include dipentaerythritol polyacrylate, dipentaerythritol hexaacrylate, pentaerythritol tetraacrylate, pentaerythritolethoxy tetraacrylate, ditrimethylolpropane tetraacrylate, and the like.

Additional exemplary acrylates contemplated for use in the practice of the present invention include those described in U.S. Pat. No. 5,717,034, the entire contents of which are hereby incorporated by reference herein.

Cyanate ester monomers contemplated for use in the practice of the present invention contain two or more ring forming cyanate (—O—C≡N) groups which cyclotrimerize to form substituted triazine rings upon heating. Because no leaving groups or volatile byproducts are formed during curing of the cyanate ester monomer, the curing reaction is referred to as addition polymerization. Suitable polycyanate ester monomers that may be used in the practice of the present invention include, for example, 1,1-bis(4-cyanatophenyl)methane, 1,1-bis(4-cyanatophenyl)ethane, 2,2-bis(4-cyanatophenyl)propane, bis(4-cyanatophenyl)-2,2-butane, 1,3-bis[2-(4-cyanato phenyl)propyl]benzene, bis(4-cyanatophenyl)ether, 4,4'-dicyanatodiphenyl, bis(4-cyanato-3,5-dimethylphenyl)methane, tris(4-cyanatophenyl)ethane, cyanated novolak, 1,3-bis[4-cyanatophenyl-1-(1-methylethylidene)]benzene, cyanated phenoldicyclopentadiene adduct, and the like. Polycyanate ester monomers utilized in accordance with the present invention may be readily prepared by reacting appropriate dihydric or polyhydric phenols with a cyanogen halide in the presence of an acid acceptor.

Monomers that can optionally be combined with polycyanate ester monomer(s) in accordance with the present invention are selected from those monomers which undergo addition polymerization. Such monomers include vinyl ethers, divinyl ethers, diallyl ethers, dimethacrylates, dipropargyl ethers, mixed propargyl allyl ethers, monomaleimides, bismaleimides, and the like. Examples of such monomers include cyclohexanedimethanol monovinyl ether, trisallylcyanurate, 1,1-bis(4-allyloxyphenypethane, 1,1-bis(4-propargyloxyphenyl)ethane, 1,1-bis(4-allyloxyphenyl-4'-propargyloxyphenyl)ethane, 3-(2,2-dimethyltrimethylene acetal)-1-maleimidobenzene, 2,2,4-trimethylhexamethylene-1,6-bismaleimide, 2,2-bis[4-(4-maleimidophenoxy) phenyl]propane, and the like.

Vinyl group-containing resins contemplated for use in the practice of the present invention refer to any resin having one or more vinyl groups (—CH=CH$_2$) thereon.

Polyesters contemplated for use in the practice of the present invention refer to condensation polymers formed by the reaction of polyols (also known as polyhydric alcohols), with saturated or unsaturated dibasic acids. Typical polyols used are glycols such as ethylene glycol; acids commonly used are phthalic acid and maleic acid. Water, a by-product of esterification reactions, is continuously removed, driving the reaction to completion. The use of unsaturated polyesters and additives such as styrene lowers the viscosity of the resin. The initially liquid resin is converted to a solid by cross-linking chains. This is done by creating free radicals at unsaturated bonds, which propagate to other unsaturated bonds in adjacent molecules in a chain reaction, linking the adjacent chains in the process.

Polyurethanes contemplated for use in the practice of the present invention refer to polymers composed of a chain of organic units joined by carbamate (urethane) links. Polyurethane polymers are formed by reacting an isocyanate with a polyol. Both the isocyanates and polyols used to make polyurethanes contain on average two or more functional groups per molecule.

Polyimides contemplated for use in the practice of the present invention refer to polymers composed of a chain of organic units joined by imide linkages (i.e., —C(O)—N(R)—C(O)—). Polyimide polymers can be formed by a variety of reactions, i.e., by reacting a dianhydride and a diamine, by the reaction between a dianhydride and a diisocyanate, and the like.

Melamines contemplated for use in the practice of the present invention refer to hard, thermosetting plastic materials made from melamine (i.e., 1,3,5-triazine-2,4,6-triarnine) and formaldehyde by polymerization. In its butylated form, it can be dissolved in n-butanol and/or xylene. It can be used to cross-link with other resins such as alkyd, epoxy, acrylic, and polyester resins.

Urea-formaldehydes contemplated for use in the practice of the present invention refers to a non-transparent thermosetting resin or plastic made from urea and formaldehyde heated in the presence of a mild base such as ammonia or pyridine.

Phenol-formaldehydes contemplated for use in the practice of the present invention refer to synthetic polymers obtained by the reaction of phenol or substituted phenol with formaldehyde.

In some embodiments, thermosetting resin compositions contemplated for use herein comprise a maleimide, nadimide or itaconimide functional group and an acrylate functional group.

In one aspect, invention compositions comprise in the range of about 5-60 wt % of said thermosetting resin compositions. In certain embodiments, invention compositions comprise in the range of about 10-25 wt % of said thermosetting resin compositions.

Invention compositions typically comprise in the range of about 0.2-2 wt % of said free-radical polymerization initiator. In certain embodiments, invention compositions comprise in the range of about 0.2-1 wt % of said free radical polymerilation initiator.

In certain embodiments, invention compositions further comprise a radical stabilizer. When present, radical stabilizers contemplated for use herein include hydroquinones, benzoquinones, hindered phenols, benzotriazole-based ultraviolet absorbers, triazine-based ultraviolet absorbers, benzophenone-based ultraviolet absorbers, benzoate-based ultraviolet absorbers, hindered amine -based ultraviolet absorbers, and the like, as well as combinations of any two or more thereof.

When present, invention compositions comprise in the range of about 0.1-1 wt % of said radical stabilizer. In some embodiments, invention compositions comprise in the range of about 0.1-0.6 wt % of said radical stabilizer.

Particulate fillers contemplated for use in the practice of the present invention are non-electrically conductive fillers having a thermal conductivity greater than silica. Exemplary fillers include aluminum oxide ($Al_2O_3$), zinc oxide (ZnO), magnesium oxide (MgO), aluminum nitride (AlN), boron nitride (BN), carbon nanotubes, diamond, clay, aluminosilicate, and the like, as well as mixtures of any two or more thereof.

In certain embodiments, invention formulations comprise aluminum oxide ($Al_2O_3$) as said thermally conductive filler.

In certain embodiments, invention formulations comprise boron nitride (BN) as said thermally conductive filler.

In certain embodiments, filler employed in invention formulations has a particle size in the range of about 0.005 μm (i.e., 5 nm) up to about 20 μm. In certain embodiments, filler employed herein has a particle size in the range of about 0.1 μm up to about 5 μm.

In certain embodiments, particulate filler comprises in the range of about 10 vol % up to about 95 vol % of said formulation. In some embodiments, particulate filler comprises in the range of about 20 vol % up to about 80 vol % of said formulation. In certain embodiments, particulate filler comprises in the range of about 20 vol % up to about 60 vol % of said formulation.

In some embodiments, the particulate filler employed in the practice of the present invention has an average particle size in the range of about 20-10,000 nanometers. In some embodiments, the particulate filler employed in the practice of the present invention has an average particle size in the range of about 20-5,000 nanometers; in some embodiments, the particulate filler employed in the practice of the present invention has an average particle size in the range of about 20-2,000 nanometers; in some embodiments, the particulate filler employed in the practice of the present invention has an average particle size in the range of about 20-1,000 nanometers; in some embodiments, the particulate filler employed in the practice of the present invention has an average particle size in the range of about 20-750 nanometers; in some embodiments, the particulate filler employed in the practice of the present invention has an average particle size in the range of about 30-750 nanometers; in some embodiments, the particulate filler employed in the practice of the present invention has an average particle size in the range of about 40-750 nanometers; in some embodiments, the particulate filler employed in the practice of the present invention has an average particle size in the range of about 50-750 nanometers; in some embodiments, the particulate filler employed in the practice of the present invention has an average particle size in the range of about 20-500 nanometers; in some embodiments, the particulate filler employed in the practice of the present invention has an average particle size in the range of about 40-500 nanometers.

Compositions according to the present invention comprise in the range of about 20-80 wt % of said particulate filler. In some embodiments, compositions according to the present invention comprise in the range of about 40-60 wt % of said particulate filler.

In certain embodiments, invention formulations optionally further comprise a non-reactive diluent therefor, which, when present, comprises in the range of about 10 up to about 70 wt %, based on the total weight of the formulation. In certain embodiments, invention compositions comprise in the range of about 10-50 wt diluent, relative to the total composition. In certain embodiments, invention compositions comprise in the range of about 20-40 wt % diluent.

Exemplary diluents contemplated for use herein, when present, include aromatic hydrocarbons (e.g., benzene, toluene, xylene, and the like), saturated hydrocarbons (e.g., hexane, cyclohexane, heptane, tetradecane), chlorinated hydrocarbons (e.g., methylene chloride, chloroform, carbon tetrachloride, dichloroethane, trichloroethylene, and the like), ethers (e.g., diethyl ether, tetrahydrofuran, dioxane, glycol ethers, monoalkyl or dialkyl ethers of ethylene glycol, and the like), polyols (e.g., polyethylene glycol, propylene glycol, polypropylene glycol, and the like), esters (e.g., ethyl acetate, butyl acetate, methoxy propyl acetate, and the like); dibasic esters, alpha-terpineol, beta-terpineol, kerosene, dibutylphthalate, butyl carbitol, butyl carbitol acetate, carbitol acetate, ethyl carbitol acetate, hexylene glycol, high boiling alcohols and esters thereof, glycol ethers, ketones (e.g., acetone, methyl ethyl ketone, and the like), amides (e.g., dimethylformamide, dimethylacetamide, and the like), heteroaromatic compounds (e.g., N-methylpyrrolidone, and the like), and the like, as well as mixtures of any two or more thereof Exemplary compositions according to the present invention comprise:
at least 20 wt % thermosetting resin,
at least 0.05 wt % curing agent,
at least 40 wt %
at least 0.1 wt % adhesion promoter,
at least 1.5 wt % toughening agent,
at least 0.5 wt % fluxing agent, and
optionally, up to 50 wt % of a non-reactive organic diluent therefor.

Additional exemplary compositions according to the present invention comprise:
5-80 wt % thermosetting resin,
0.01-2 wt % curing agent,
20-95 wt % filler,
0.1-2 wt % adhesion promoter,
1-15 wt % toughening agent,
0.5-5 wt % fluxing agent, and
optionally, 10-50 wt % of a non-reactive organic diluent therefor.

In certain embodiments, still further exemplary compositions according to the present invention comprise:
25-60 wt % thermosetting resin,
0.05-0.2 wt % curing agent,
40-75 wt %
0.2-1 wt % adhesion promoter,
2-10 wt % toughening agent,
1-3 wt % fluxing agent, and
optionally, 20-40 wt % of a non-reactive organic diluent therefor.

In accordance with another embodiment of the present invention, there are provided methods of making the compositions described herein, said methods comprising combining the components thereof under conditions suitable to produce a substantially homogeneous blend thereof.

In accordance with yet another embodiment of the present invention, there are provided B-staged aliquots of the formulations described herein.

In accordance with still another embodiment of the present invention, there are provided cured aliquots of the formulations described herein.

In accordance with a further embodiment of the present invention, there are provided curable films comprising B-staged aliquots of the formulations described herein.

In accordance with another embodiment of the present invention, there are provided films comprising a cured layer of a formulation as described herein.

In accordance with yet another embodiment of the present invention, there are provided underfill films comprising the reaction product obtained upon B-stage curing a composition as described herein. Underfill films according to the present invention have excellent transparency. For example, underfill films according to the present invention have at least 10% transparency to wavelengths of 555 nm or longer. In some embodiments, underfill films according to the present invention have at least 20% transparency to wavelengths of 555 nm or longer; in some embodiments, underfill films according to the present invention have at least 30% transparency to wavelengths of 555 nm or longer; in some embodiments, underfill films according to the present invention have at least 40% transparency to wavelengths of 555 nm or longer; in some embodiments, underfill films according to the present invention have at least 50% transparency to wavelengths of 555 nm or longer; in some embodiments, underfill films according to the present invention have at least 60% transparency to wavelengths of 555 nm or longer; in some embodiments, underfill films according to the present invention have at least 70% transparency to wavelengths of 555 nm or longer; in some embodiments, underfill films according to the present invention have at least 80% transparency to wavelengths of 555 nm or longer; in some embodiments, underfill films according to the present invention have at least 90% transparency to wavelengths of 555 nm or longer;

In accordance with still another embodiment of the present invention, there are provided methods for preparing underfill films, said method comprising curing a composition as described herein after application thereof to a suitable substrate. Suitable substrates contemplated for use herein include polyethylene terephthalate, polymethyl methacrylate, polyethylene, polypropylene, polycarbonate, an epoxy resin, polyimide, polyamide, polyester, glass, silicon, and the like.

In accordance with a further embodiment of the present invention, there are provided articles comprising an underfill film as described herein adhered to a suitable substrate therefor.

In accordance with yet another embodiment of the present invention, there are provided assemblies comprising a first article permanently adhered to a second article by a cured aliquot of a formulation as described herein.

In accordance with a still further embodiment of the present invention, there are provided methods for preparing an underfill film, said methods comprising:
applying a composition as described herein to a suitable substrate, and thereafter
curing said composition.

In accordance with another embodiment of the present invention, there are provided underfill films prepared as described herein.

In accordance with yet another embodiment of the present invention, there are provided methods of improving the heat dissipation by electronic devices assembled employing thermally conductive, but electrically non-conductive adhesive, said methods comprising employing as the filler for said thermally conductive, but electrically non-conductive adhesive a filler which imparts sufficient thermal conductivity to said formulation such that the formulation, upon cure, has a thermal conductivity of at least 0.5 W/mK.

Exemplary electronic devices contemplated for improvement according to the above-described method include flip chip packages, stacked dies, hybrid memory cubes, through-silica vertical interconnect (TSV) devices, and the like.

In accordance with yet another embodiment of the present invention, there are provided packages prepared by the above-described methods. Exemplary packages include packages comprising a plurality of dies adhered by the formulations according to the present invention.

Various aspects of the present invention are illustrated by the following non-limiting example. The example is for illustrative purposes and is not a limitation on any practice of the present invention. It will be understood that variations and modifications can be made without departing from the spirit and scope of the invention. One of ordinary skill in the art readily knows how to synthesize or commercially obtain the reagents and components described herein.

EXAMPLE

Compositions were prepared containing each of the components contemplated above, i.e.,
at least 20 wt % thermosetting resin,
at least 0.05 wt % curing agent,
at least 40 wt % filler,
at least 0.1 wt % adhesion promoter,
at least 1.5 wt % toughening agent,
at least 0.5 wt % fluxing agent, and
optionally, up to 50 wt % of a non-reactive organic diluent therefor.

Each of the compositions prepared for this example contain the same quantity of organic components, wherein the control comprises 45 vol % (60 wt %) silica filler, and invention sample 1 contains 50 vol % (75 wt %) alumina, and invention sample 2 contains 26 vol % (40 wt %) boron nitride, as shown in the following table.

TABLE 1

| Component | | | | Sample | | | | | | |
|---|---|---|---|---|---|---|---|---|---|---|
| | | | Invention Sample | | | | Invention Sample | | | |
| Type | Identity | Control | #1A | #1B | #1C | #1D | #2A | #2B | #2C | #2D |
| Toughening agent | Nanostrength ® block copolymers | 10.2 | 15.31 | 10.21 | 8.29 | 6.38 | 20.40 | 15.30 | 12.75 | 8.925 |
| Epoxy resin | 24-440B | 6 | 9.00 | 6.00 | 4.88 | 3.75 | 12.00 | 9.00 | 7.50 | 5.25 |
| Acrylate resin | SR368 | 8 | 12.00 | 8.00 | 6.50 | 5.00 | 13.33 | 10.00 | 8.33 | 5.83 |
| Epoxy resin | 24-331A | 0.6 | 0.91 | 0.61 | 0.49 | 0.38 | 1.20 | 0.90 | 0.75 | 0.525 |
| Epoxy resin | Epiclon N665-EXP | 2 | 3.00 | 2.00 | 1.63 | 1.25 | 4.00 | 3.00 | 2.50 | 1.75 |
| hardener | 2PHZ | 0.13 | 0.19 | 0.13 | 0.10 | 0.08 | 0.26 | 0.20 | 0.16 | 0.11 |
| bismalcimide resin | BMI resin | 10.07 | 15.10 | 10.06 | 8.18 | 6.29 | 20.14 | 15.11 | 12.59 | 8.81 |
| Adhesion promoter | Z6040 | 0.4 | 0.60 | 0.40 | 0.33 | 0.25 | 0.80 | 0.60 | 0.50 | 0.35 |
| Inorganic fillers | Silica | 60 | — | — | — | — | — | — | — | — |
| | Boron nitride | — | — | — | — | — | 20.00 | 40.00 | 50.00 | 65.00 |
| | Alumina | — | 40.00 | 60.00 | 67.50 | 75.00 | — | — | — | — |
| Radical initiator | Dicumyl peroxide | 0.4 | 0.60 | 0.40 | 0.33 | 0.25 | 0.80 | 0.60 | 0.50 | 0.35 |
| Fluxing agent | Glutaric acid | 2 | 3.00 | 2.00 | 1.63 | 1.25 | 4.00 | 3.00 | 2.50 | 1.75 |
| Radical inhibitor | 8-Hydroxyquinoline | 0.2 | 0.30 | 0.20 | 0.16 | 0.13 | 0.40 | 0.30 | 0.25 | 0.175 |

Various performance properties of the above-described formulations were tested; the results are summarized in Table 2 below.

TABLE 2

| Property (units) | Control | Invention Sample #1A | #1B | #1C | #1D | Invention Sample #2A | #2B | #2C | #2D |
|---|---|---|---|---|---|---|---|---|---|
| Thermal conductivity, W/mK | 0.4 | 0.49 | 0.60 | 0.88 | 1.09 | 0.45 | 0.91 | 2.42 | 3.44 |
| Transmittance @ 550 nm, % | 83.8 | 68.6 | 67 | 58 | 57 | 48 | 40 | 38 | 15.3 |
| Melt viscosity, P | 15,560 | 302 | 1,744 | 3,070 | 7,320 | 681 | 14,440 | 70,520 | — |
| Tg by TMA (10° C./min) | 105 | — | — | — | 140 | — | 91 | 103 | — |
| CTE1 (ppm/° C.) | 33 | — | — | — | 40 | — | 59 | 62 | — |
| CTE2 (ppm/° C.) | 77 | — | — | — | 75 | — | 159 | 139 | — |
| Tg by DMA (5° C./min, tan delta) | 156 | — | — | — | 206 | — | 238 | 248 | — |
| Storage modulus @ 25° C. (GPa) | 7,252 | — | — | — | 8,047 | — | 9,680 | 11,855 | — |
| Storage modulus @ 250° C. (MPa) | 371 | — | — | — | 575 | — | 537 | 897 | — |

The results set forth in the preceding tables demonstrate that invention compositions have improved performance properties relative to formulations prepared with less thermally conductive filler such as silica.

Various modifications of the present invention, in addition to those shown and described herein, will be apparent to those skilled in the art of the above description. Such modifications are also intended to fall within the scope of the appended claims.

Patents and publications mentioned in the specification are indicative of the levels of those skilled in the art to which the invention pertains. These patents and publications are incorporated herein by reference to the same extent as if each individual application or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

That which is claimed is:

1. A formulation comprising:
   a thermosetting resin composition comprising an epoxy resin, a (meth)acrylate resin, and one or more of a maleimide, a nadimide, or an itaconamide resin,
   a curing agent,
   a fluxing agent, and
   a filler in the range of about 20 vol % up to about 60 vol. % which imparts sufficient thermal conductivity to said formulation such that said formulation, upon cure, has a bulk thermal conductivity of greater than 0.5 W/mK, as measured by the laser flash method,
   wherein:
      said formulation, as a B-staged film, has a minimum melt viscosity of <40,000 P, as measured by Ares Rheometer at 10 Rad frequency with a 10° C./min ramp rate using a sample 1 inch in diameter and 1 mm thick and said formulation, as a B-staged film, after cure, has a Tg greater than 80° C.; a coefficient of thermal expansion below Tg (CTE1) of less than 60 ppm/° C. and a coefficient of thermal expansion above Tg (CTE2) of less than 160 ppm/° C.; and a transmittance of at least 10% at a wavelength of 555 nm or longer.

2. The formulation of claim 1 further comprising one or more flow additives, adhesion promoters, rheology modifiers, toughening agents, conductivity additives, or mixtures of any two or more thereof.

3. The formulation of claim 1 further comprising a non-reactive diluent therefor, which comprises in the range of about 10 up to about 70 wt %, based on the total weight of the formulation.

4. The formulation of claim 3 wherein said diluent is selected from the group consisting of aromatic hydrocarbons, saturated hydrocarbons, chlorinated hydrocarbons, ethers, polyols, esters, dibasic esters, alpha-terpineol, beta-terpineol, kerosene, dibutylphthalate, butyl carbitol, butyl carbitol acetate, carbitol acetate, ethyl carbitol acetate, hexylene glycol, high boiling alcohols and esters thereof, glycol ethers, ketones, amides, heteroaromatic compounds, and mixtures of any two or more thereof.

5. The formulation of claim 1 wherein said thermosetting resin composition further comprises a member selected from the group consisting of a cyanate ester, a vinyl group-containing resin, a cyclic ester, a benzoxazine, an oxetane, a silicone resin, a polyester, a polyurethane, a polyimide, a melamine, an urea-formaldehyde, a phenol-formaldehyde, and mixtures of any two or more thereof.

6. The formulation of claim 1 wherein said curing agent is a free radical initiator and/or an epoxy hardener.

7. The formulation of claim 1 wherein said filler is a non-electrically conductive filler having a thermal conductivity greater than silica.

8. The formulation of claim 1 wherein said filler is selected from the group consisting of aluminum oxide ($Al_2O_3$) magnesium oxide (MgO), zinc oxide (ZnO), aluminum nitride (AlN), boron nitride (BN), carbon nanotubes, diamond, clay, aluminosilicate, and mixtures of any two or more thereof.

9. The formulation of claim 7 wherein said thermally conductive filler is aluminum oxide ($Al_2O_3$).

10. The formulation of claim 7 wherein said thermally conductive filler is boron nitride (BN).

11. The formulation of claim 7 wherein said filler has a particle size in the range of about 0.005 μm up to about 20 μm.

12. The formulation of claim 1 wherein said formulation, upon cure, has a thermal conductivity of at least about 1.0 W/mK.

13. The formulation of claim 1 wherein said thermosetting resin composition comprises at least one epoxy.

14. A B-staged aliquot of the formulation of claim 1.

15. A cured aliquot of the formulation of claim 1.

16. A curable film comprising a B-staged layer of the formulation of claim 1 on a suitable substrate thereof.

17. A film comprising a cured layer of the formulation of claim 1.

18. An assembly comprising a first article permanently adhered to a second article by a cured aliquot of a formulation according to claim 1.

19. A method for adhesively attaching a first article to a second article, said method comprising:
   (a) applying an aliquot of the formulation of claim 1 to said first article,
   (b) bringing said first and second articles into intimate contact to form an assembly
      wherein the space between said first article and said second article is substantially completely filled by the formulation applied in step (a), and thereafter
   (c) optionally subjecting said assembly to conditions suitable to cure said formulation.

20. A package comprising a plurality of dies adhered by the formulation of claim 1.

* * * * *

UNITED STATES PATENT AND TRADEMARK OFFICE
CERTIFICATE OF CORRECTION

PATENT NO. : 10,913,879 B2
APPLICATION NO. : 15/229596
DATED : February 9, 2021
INVENTOR(S) : Jie Bai et al.

Page 1 of 1

It is certified that error appears in the above-identified patent and that said Letters Patent is hereby corrected as shown below:

In the Specification

Column 6, Line 56 change "1,1-bis (4-allyloxyphenypethane" to --1,1-bis (4-allyloxyphenyl)ethane--.

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*